United States Patent [19]

Ong et al.

[11] Patent Number: 5,196,361
[45] Date of Patent: Mar. 23, 1993

[54] METHOD OF MAKING SOURCE JUNCTION BREAKDOWN FOR DEVICES WITH SOURCE-SIDE ERASING

[75] Inventors: Tong-Chern Ong, San Jose; Been-Jon Woo, Saratoga, both of Calif.

[73] Assignee: Intel Corporation, Santa Clara, Calif.

[21] Appl. No.: 700,512

[22] Filed: May 15, 1991

[51] Int. Cl.⁵ .......................................... H01L 21/266
[52] U.S. Cl. ...................................... 437/43; 437/38; 437/45
[58] Field of Search .................. 437/30, 35, 43, 44, 437/45, 70, 38; 148/DIG. 13

[56] References Cited

U.S. PATENT DOCUMENTS

| | | | |
|---|---|---|---|
| 4,062,699 | 12/1977 | Armstrong | 437/45 |
| 4,342,149 | 8/1982 | Jacobs et al. | 437/70 |
| 4,499,652 | 2/1985 | Shrivastava | 437/45 |
| 4,514,897 | 5/1985 | Chiu et al. | 437/44 |
| 4,698,787 | 10/1987 | Mukherjee | 357/23.5 |
| 4,780,424 | 10/1988 | Holler | 437/43 |
| 4,829,019 | 5/1989 | Mitchell et al. | 437/70 |
| 4,895,520 | 1/1990 | Berg | 437/45 |
| 4,968,639 | 11/1990 | Bergonzoni | 437/45 |
| 5,019,520 | 5/1991 | Komori et al. | 437/45 |

OTHER PUBLICATIONS

Kume, et al.; "A flash EEPROM Cell with an Asymmetric Source and Drain Structure"; *IEDM;* 1987; pp. 560-563.

Ohshima, et al.; "Process and Device Technologies for 16 Mbit EPROMs with Large-Tilt-Angle Implanted P-Pocket Cell"; *IEDM;* 1990; pp. 95-98.

Gill, et al.; "A 5-Volt Contactless Array 256 Kbit Flash EEPROM Technology" *IEDM;* 1988; pp. 428-431.

*Primary Examiner*—Brian E. Hearn
*Assistant Examiner*—C. Chaudhari
*Attorney, Agent, or Firm*—Blakely Sokoloff Taylor & Zafman

[57] ABSTRACT

A method for making a device and the device itself which utilizes selectively doping part of the channel directly adjacent to the source to improve source-channel junction breakdown voltage is disclosed. This is accomplished through reduced dopant incorporation in the channel directly adjacent to the source during the channel doping steps. The portion of the channel which receives less channel dopant should not be so great that the charging of the floating gate is significantly altered.

26 Claims, 1 Drawing Sheet

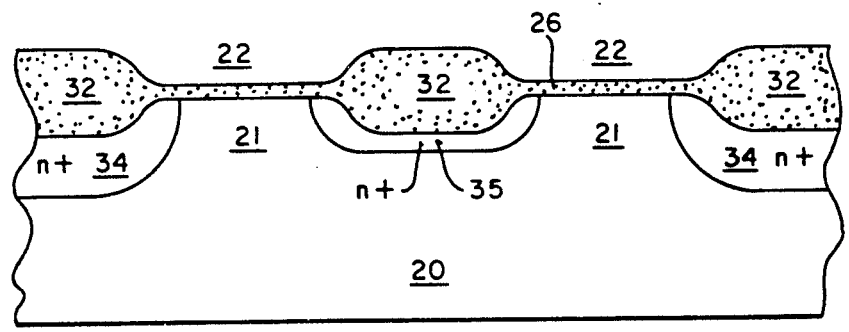
FIG_1
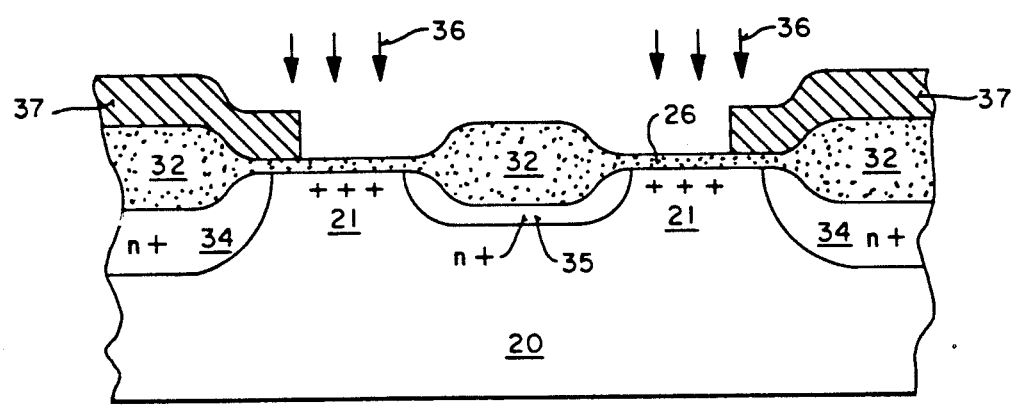
FIG_2
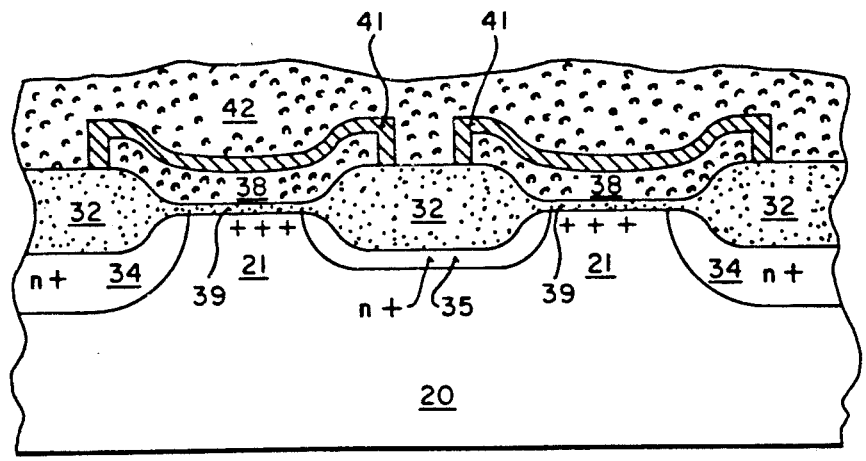
FIG_3

METHOD OF MAKING SOURCE JUNCTION BREAKDOWN FOR DEVICES WITH SOURCE-SIDE ERASING

FIELD OF THE INVENTION

The present invention relates generally to the field of processing semiconductor devices, and in particular, to memory devices which have floating gates that are erased through the source of a metal oxide semiconductor (MOS).

BACKGROUND OF THE INVENTION

An electrically programmable read only memory (EPROM) is a type of device which has a plurality of floating gates that are either charged or not charged. Some EPROMs are programmed by channel hot-electron injection which is initiated by grounding the source, biasing the drain to a voltage usually higher than the supply voltage, and taking the control gate to a voltage sufficiently high to cause charge accumulation within the floating gate. Typically, the control gate programming voltage is between about 10 volts to 20 volts. Many EPROMs use ultraviolet radiation to remove electrons from the floating gate. However, there are other EPROMs in which the whole memory array is erased at one time and are referred to as flash EPROMs. One type of flash EPROM has a tunnel dielectric which is usually a thin oxide between the floating gate and the substrate as described in U.S. Pat. No. 4,780,424 issued to Holler (hereinafter referred to as Holler). Such a device is erased by disconnecting the drain, grounding the control gate, and taking the source to a sufficiently positive voltage, typically between 10 V and 20 V, to remove the accumulated charge from the floating gate through the tunneling process. The parameters and method used for programming and erasing vary greatly between devices, but devices which are erased by taking the source to a high electrical potential may have problems if the source-channel junction breakdown voltage is too low. As will be described later, these problems with the device arise during erasing if the channel of the device has been doped.

The device has field isolation regions between the circuits within the memory array. The source and drains may lie below the field oxide, or they may be directly adjacent to the field oxide. These circuits have a channel which is the area immediately beneath where the tunnel dielectric is subsequently formed and between the source diffusion junction and the drain diffusion junction. Before the floating gates are formed over those channels, the channels are doped. In the prior art, channel doping has been performed as a blanket doping across the memory array. By a blanket doping, it is meant that there is no mask covering any portion of the memory array. The dopant enters the entire surface of the memory array. The dopant is usually introduced into the substrate by ion implant. During ion implant, the ions do not travel through the thick field oxide. The same ions travel through a thinner dielectric which resides in the interfield oxide regions (regions between the field oxide regions), part of which becomes the channel. A good example of this process is described in Holler in which the amount of dopant within the channel is relatively uniform across the lateral area of the channel. Therefore, the doping concentration within the channel near the source is about the same as the doping concentration near the drain.

Many EPROMs have more than one channel dopant. A particular prior art process has two key channel doping steps. The first doping step, referred to as enhancement implant (ENI), adjusts the threshold voltage of the device. A key design consideration requires that the dopant remain relatively close to the silicon-tunnel dielectric interface. A second channel doping step referred to as punchthrough adjust implant (PCHI) increases the voltage required to cause current to flow between the source and the drain while the gate is at ground potential. PCHI goes deeper into the substrate than the ENI. Both of these implants affect the erasing of the EPROM device described above.

During the erasing of a flash EPROM as previously described, the source voltage is taken to a high potential. A high source voltage during erasing is required to initiate the electron tunneling process through the tunnel dielectric which lies between the floating gate and the channel. Unfortunately, this high source voltage can be near or above the source-channel junction breakdown voltage depending on the channel doping concentration at the source end. The amount of substrate current is primarily governed by the source-channel junction breakdown. Once the source-channel junction has been broken down, the electrons flow much more freely between the substrate and the source causing a large substrate current. If the source voltage during erasing is less than the source-channel junction breakdown voltage, the electrons in the substrate have a much harder time flowing to the source. As will be discussed later, high substrate current is to be avoided, and therefore, the source-channel junction breakdown voltage must be higher than the source voltage during erasing.

Consequently, the voltage on the source during erasing may be limited by the breakdown voltage of the source-channel junction. A relatively lower source-channel junction breakdown voltage leads to a number of problems during erase. First, a lower source-channel junction breakdown voltage means that substrate current during erasing is higher. During erasing, the substrate current can reach 10 $\mu$A per cell and may exceed 20 $\mu$A per memory cell when the source voltage is very low. High substrate current is both a reliability and design problem. It is a reliability problem in that high substrate current may generate more holes which are injected into tunnel dielectric and cause problems discussed below. Higher substrate current means the device runs hotter and may cause layers within the device to crack or sever. As a design issue, the substrate current generates more noise which could propagate to other circuits within the device and interfere with the operation of the device.

Lower source voltage increases the number of holes that are injected into the tunnel dielectric during erasing. The holes within the dielectric degrade the capacitive properties of the tunnel dielectric, so that the dielectric is not able to support as much electrical field. In addition, holes within the tunnel dielectric could cause charge loss from a programmed floating gate. Eventually, enough charge loss creates a state such that the voltage on the floating gate is at an indeterminate value which is between a fully programmed state and an erased state. The transistor could become "leaky", meaning that the floating gate electrons disappear and therefore, a programmed cell could become an erased cell. Such a state is not desired in an EPROM. Hole injection into the tunnel dielectric during erasing must be kept low. A number of prior art attempts are described immediately below. All of the prior art attempts discussed below focus on raising the source-channel junction breakdown voltage.

Semiconductor junction breakdown is governed by classical diffused junction breakdown mechanics described in many semiconductor physics textbooks. Decreasing the source doping concentration in a given device increases the source-channel junction breakdown voltage. Reducing the doping concentration of the source has not been a desired solution because the source must be highly conductive. In a contactless electrically programmable and electrically erasable memory device of the flash EPROM type, the source contacts have been purposely kept to the outer areas of the array so that multiple contacts within the array do not need to be made. As such, the source must be very conductive along the entire length of the array. If the source dopant would be reduced, the conductivity of the source would also be reduced resulting in higher source resistances than as determined by the device design. The higher source resistance slows down the access time of the device.

Another prior art attempt has been to grade the source doping concentration even more. With the memory cell of Holler, the source was formed by two separate ion implants. The first implant uses arsenic implant which keeps the arsenic dopant relatively closer to the silicon-field oxide interface and the second implant uses phosphorus which diffuses faster than arsenic. The faster diffusing phosphorous is at the source-channel junction. If the source junction were to be graded even further, more phosphorous or some other n-type dopant would be further into the channel. As the source-channel junction gets closer to the drain-channel junction, the punchthrough voltage is reduced which is not desired. Therefore, further grading of the source junction is not possible.

Another prior art attempt to increase the source-channel junction breakdown voltage could include reducing or eliminating the ENI concentration for the entire channel. The device requires the ENI dose to be kept sufficiently high enough so that the programming characteristics of the EPROM remain the same. More specifically, the dopant at the drain segment of the channel needs to remain unchanged since the device as described herein uses channel hot-electron injection from the drain side to program the memory cell. The programming characteristics of the memory cell remain the same since the doping concentration for the drain segment is unchanged. The reduced or eliminated ENI could adversely affect the read threshold voltage of the device. No ENI would produce a very leaky transistor to the point where current could flow between the source and drain such that a programmed cell within the same column of the memory array could be read as an unprogrammed cell. A reduced or no ENI would not be a solution.

The last prior art attempt to increase the source-channel junction breakdown voltage could include reducing or eliminating the PCHI concentration within the entire channel. The function of PCHI is to increase the voltage required to cause current to flow between the source and drain (punchthrough voltage). As the PCHI concentration decreases, the punchthrough voltage becomes lower. A desired characteristic of the device has a relatively high punchthrough voltage which allows closer spacing between the source and the drain. This increases the number of die per substrate and increases yield as the same device occupies less area which reduces the chances that the device has a fatal silicon crystal defect. Therefore, lowering the PCHI concentration would not be a solution to the current problem.

SUMMARY OF THE INVENTION

In view of the foregoing, it is an important object of the present invention to produce a semiconductor device which has a higher source-channel junction breakdown voltage to reduce substrate current and reduce hole injection into the tunnel dielectric during erasing.

It is an additional object of the present invention to increase the source-channel junction breakdown without significantly altering the programming of the device.

It is yet another object of the present invention to increase the source-channel junction breakdown without significantly changing the design of the device.

It is a further object of the present invention to increase the source-channel breakdown voltage while maintaining an uncomplicated and reliable manufacturing process.

As will be described in more detail hereinafter, the present invention resides in selectively doping the channel so that a significantly reduced amount of channel dopant is present in a segment of the channel adjacent to the source to improve the source-channel junction breakdown voltage. To applicants' knowledge, no one has considered heretofore, selectively doping the channel for the purposes of increasing the source-channel junction breakdown voltage. By selectively doping the channel, applicants have discovered a device with an increased source-channel junction breakdown voltage. The higher breakdown voltage allows a higher potential to be put onto the source during erasing. The invention produces a device with faster erasure time, less substrate current during erasing, and less hole injection into the tunnel dielectric during erasing.

BRIEF DESCRIPTION OF THE DRAWINGS

FIG. 1 is a cross sectional view of a semiconductor substrate immediately prior to the channel doping steps.

FIG. 2 is a cross sectional view of the substrate of FIG. 1 illustrating selective channel doping using ion implant with a resist mask covering a segment of the channel adjacent to the source in accordance with the present invention.

FIG. 3 is a cross sectional view of the substrate of FIG. 2 following the formation of the floating gate, the dielectric over the floating gate, and the control gate.

DETAILED DESCRIPTION OF THE PRESENT INVENTION

The invention which is a method for making a device and the device itself where selective doping of a channel is used to improve the source-channel junction breakdown voltage of a device having a floating gate erased by placing the source at a high potential is disclosed. The method of the present invention produces a lower doping concentration in the channel within the area adjacent to the source, thereby increasing the breakdown voltage of the source-channel junction. While most of the discussion of this application involves flash EPROM devices, the present invention can be utilized in any device which is erased through its source. In the following description, numerous details are set forth, such as specific materials, process parameters, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

Before describing the invention, a couple of terms are defined to eliminate confusion. In FIG. 1, the substrate areas which lie between adjacent field oxide regions 32 are referred to as "interfield oxide regions" and are represented by 22. The areas within the substrate directly below the interfield dielectrics 26 and extending between the adjacent sources and drains are referred to as "channels" and are represented by 21. As shown in FIG. 1, the interfield oxide region covers the entire channel and that portion of the source and drain which does not lie beneath the field oxide. The interfield oxide region and channel are sometimes referred to as "channel" and "effective channel", respectively. Due to the similarity of terms involved, channel and effective channel were not used since the word "channel" may be ambiguous. Within this application, only the terms "interfield oxide region" and "channel" are used.

The preferred embodiment for all but the channel doping steps relies upon the process steps for fabricating an electrically erasable flash EPROM cell as described in the above referenced U.S. Patent to Holler which is herein incorporated by reference. This procedure is equally suited for any device which utilizes erasing a floating gate by placing the source at a high potential. The substrate is subjected to many different process steps which define the electrical components which make up the integrated circuits, as described by Holler. The actual steps other than the channel doping steps are well known in the art, and in any event are not critical to the invention. Hence, these steps will not be discussed herein.

A diffused junction breakdown is a function of the doping concentration on both sides of the junction. As the doping concentration on either side of the junction is reduced, the breakdown voltage of the junction increases. Certain types of flash EPROMs are erased by placing a relatively high voltage on the source, grounding the gate, and disconnecting the drain. The voltage on the source is normally between 11.4 V and 12.6 V, but it can range between 10 V and 20 V. Higher source-channel junction breakdown voltage is desired for the reasons previously discussed. The prior art attempts have increased the junction breakdown voltage at the expense of device performance. To applicant' knowledge, selective doping of the channel has not been used to increase the source-channel junction breakdown voltage as stated previously.

Unexpectedly, applicants found that when only the source segment of the channel receives a reduced level or none of the channel doping, the source-channel junction breakdown voltage increases without sacrificing device performance. As stated previously, reducing the channel doping should adversely affect the programming of the floating gate and decrease the punch-through voltage. If the segment becomes too great, these problems may arise. When the segment occupies less than half of the channel, the device performance is not significantly altered. The device performs best when 10% to 20% of the channel area adjacent to the source receives little or none of the channel doping. The invention gives a higher source-channel junction breakdown voltage without significantly changing programming and punchthrough voltage.

It has been found that the invention yields additional benefits for the reasons stated within this paragraph. The higher source-channel junction breakdown voltage means a lower substrate current during erasing which reduces substrate noise and heat generated by the device. Problems with noise and heat generation have been previously discussed. Another benefit is reduced hole injection into the tunnel dielectric during erase. With the invention, it takes more cycles (programming followed by erase) to accumulate the same number of holes in the tunnel dielectric compared to blanket doping. Less holes in the tunnel dielectric means that the tunnel dielectric is able to maintain its dielectric properties for a longer time, cause less charge loss from the floating gate, and is less likely to form a leaky transistor as compared to blanket doping. A further benefit of the present invention is that the lower doping near the source allows the source side of the channel to turn on quicker, thereby increasing the read current which results in quicker access time yielding better performance from the device.

In summary, the present invention selectively dopes the channel to increase the source-channel junction breakdown voltage. A device produced in accordance with the present invention has improved performance and is more reliable. Now that the requirements of the invention have been addressed, attention is directed to the manner of forming the selectively doped channel.

FIG. 1 shows the substrate immediately prior to the channel doping steps. A lightly doped p-type monocrystalline silicon substrate is shown as 20. The field oxide regions are indicated at 32. The source regions are shown as 34, and the drain is depicted at 35. A thin dielectric (interfield dielectric 26) is present over the interfield oxide regions 22, and the channel areas are generally indicated as 21. According to the prior art, the entire memory array formed thus far received a blanket ion implant, and therefore, no resist was present in the designated area. In the prior art, all of the array received the ion implant which included the field oxide regions, the entire channel, part of the source, and part of the drain.

FIG. 2 shows the invention as illustrated with a doping mask 37 to prevent doping of the source and a segment of the channel 21 directly adjacent to the source. In the preferred embodiment, photoresist is used for the doping mask. The size of the masked segment is critical to the invention. When the masked area becomes too large, device programming and the punchthrough voltage are adversely affected, and when the masked area becomes too small, improvements in the source-channel junction breakdown voltage will not be achieved. In the preferred embodiment, the mask covers between 10% and 20% of the channel 21. The doping steps consist of one or more ion implants 36. In the preferred embodiment, an enhancement implant (ENI) and a punch-through adjust implant (PCHI) are performed. ENI is implanted using B+11 at an energy between 30 KeV to 50 KeV and a dose between 8E12 and 1.2E13 ions/cm$^2$. PCHI is implanted using B+11 at an energy of about 125 KeV and a dose between 6E12 and 1E13 ions/cm$^2$. The implants could be performed with other boron species such as BF$_2$+49. The energy of the implant would need to be adjusted accordingly. While the order of the implants is not critical to the invention, the effects of these doping steps will be discussed immediately below.

ENI has a relatively light doping level (compared to the source and drain doping), and the dopant resides close to the interfield dielectric 26 when implanted. ENI adjusts the threshold voltage of the device, and the dopant must reside close to the tunnel dielectric (which may be the same as the interfield dielectric or a subsequently formed dielectric). It is the presence of dopant near the tunnel dielectric at the source end of the channel that decreases the source-channel junction breakdown. The photoresist is approximately 1 μm thick and therefore prevents almost all dopant from entering the masked area of the channel. Any reduction of ENI dopant near the source improves performance, and hence, it is not essential that all ENI dopant be excluded. However, in the preferred embodiment, all or at least most of dopant is excluded.

PCHI is done for a different purpose, but the analysis proceeds along a similar vein. PCHI is used to increase the source to drain punchthrough voltage. The dopant resides deeper in the channel, hence the implant energy is greater. The deeper lying PCHI has less impact on erasing compare to ENI since the PCHI dopant is further from the location where the tunnel erase actually occurs. The mask for PCHI is not as critical as it is for ENI, but any reduction of dopant at the source-channel interface improves performance. Like ENI, any reduction of PCHI dopant near the source improves performance, and accordingly, it is not essential that all PCHI dopant be excluded. However, in the preferred embodiment, all or at least most of dopant is excluded.

Additional processing steps are performed to give a device with a structure shown in FIG. 3. The interfield dielectric 26 has been replaced by a high quality tunnel dielectric 39. The floating gates 38 are shown with dielectric layers 41 formed over them, and a control gate 42 is formed over the dielectric layers 41. Passivation layers and contacts (not shown) are formed over the underlying layers to complete the device. The processing steps which form these post-channel doping steps are well known in the art, and in any event are not critical to the invention. Hence, the formation of these layers is not discussed herein.

The present invention can be performed using alternative methods as will be exemplified hereinafter. As will be seen, the examples illustrate some of the process options and are not intended to limit the scope of the invention. Substrate masking is not needed if the ion implanter can be programmed to selectively implant only predetermined portions of the substrate.

Furnace doping may be used, although dopant control within a furnace is very difficult. Furnace doping steps are best for high doping concentrations where dopant control is not as critical, such as the source and drain. ENI and PCHI are relatively low concentration implants. In the case of ENI, dopant control must be precise. The programming and reading of the device is greatly impacted by variations with the ENI doping concentration. While it is unlikely that a furnace doping of the channel will be used, it is still possible that furnace doping could be used with the invention.

Different masking materials can be used with the invention which may include silicon nitride, silicon dioxide, silicon oxynitride, and deposited silicon. For ion implant, a photoresist mask is preferred, although, others could be used. The alternate masking materials are required if a furnace doping step is used since photoresist cannot withstand the higher temperatures of a furnace doping cycle. These alternate masking materials require the additional steps of layer formation, pre-doping etch, and a post-doping etch. The doping occurs between the etch steps.

The figures show that the channel doping occurs after the formation of the source and drain. In other device constructions, the channel doping may occur prior to forming the source and drain. The design of the mask must account for the portion of the interfield oxide region which will be where the channel segment adjacent to the source finally resides.

The interfield dielectric is the dielectric present within the interfield oxide region when the doping sequence is performed. The invention does not require the dielectric to be present during the doping steps, but other unrelated process considerations determine whether or not the interfield dielectric is present at the time of channel doping. The interfield dielectric may be used as the tunnel dielectric which must be an extremely high quality dielectric since it will be subjected to the stresses of programming and erasing and must prevent charge loss from the floating gate. The preferred embodiment removes the interfield dielectric and forms a subsequent high quality tunnel dielectric made of silicon dioxide. The invention can be used after the tunnel dielectric is formed, although other unrelated processing considerations may prevent this option.

Thus, a method and a device with for substantially improved the source-channel junction breakdown voltage without degraded device performance has been described.

We claim:

1. A method of forming an electrically erasable and electrically programmable memory cell on a semiconductor substrate, the cell having a first region and a second region within the substrate, the cell being electrically erasable through the first region, the method comprising the steps of:

forming the first region and the second region within the substrate, wherein a channel area lies between and adjacent to the first region and the second region, the channel area having a first segment directly adjacent to the first region and a second segment directly adjacent to the second region;

masking said first segment of the channel area:

doping the channel area with a dopant wherein, due to said masking step, the first segment is doped to a first concentration and the second segment is doped to a second concentration, the second concentration being heavier than the first concentration.

2. The method of claim 1, wherein the first segment is less than half of the channel area.

3. The method of claim 2, wherein the first region is the source region of the cell and the second region is the drain region of the cell.

4. The method of claim 3, wherein the cell is part of a flash EPROM.

5. The method of claim 2, wherein the first segment has an area in the range of approximately 10% to 20% of the channel area.

6. The method of claim 2, wherein the doping is performed by ion implantation using an ion selected from the group consisting of B+11 and BF2+49, a dose in the range of approximately 6E12 ions/cm$^2$, and an energy in the range of approximately 30 KeV to 125 KeV.

7. The method of claim 1, wherein the first region is the source region of the cell and the second region is the drain region of the cell.

8. The method of claim 7, wherein the cell is part of a flash EPROM.

9. The method of claim 7, wherein the first segment is less than half of the channel area.

10. The method of claim 7, wherein the doping is performed by ion implantation using an ion selected from the group consisting of B+11 and BF2+49, a dose in the range of approximately 6E12 ions/cm$^2$, and an energy in the range of approximately 30 KeV to 125 KeV.

11. The method of claim 1, wherein the cell is part of a flash EPROM.

12. The method of claim 11, wherein the first segment is less than half of the channel area.

13. The method of claim 11, wherein the doping is performed by ion implantation using an ion selected from the group consisting of B+11 and BF2+49, a dose in the range of approximately 6E12 ions/cm$^2$, and an energy in the range of approximately 30 KeV to 125 KeV.

14. A method of forming an electrically erasable and electrically programmable memory cell on a semiconductor substrate, the cell having a first region and a second region within the substrate, the cell being electrically erasable through the first region, the method comprising the steps of:

forming the first region and the second region within the substrate, wherein a channel area lies between and adjacent to the first region and the second region, the channel area having a first segment directly adjacent to the first region and a second segment directly adjacent to the second region;

selectively masking said channel area to block dopants from entering the first segment:

doping the channel area with a dopant wherein due to said selective masking step, the first segment is undoped and the second segment is doped.

15. The method of claim 14, wherein the first segment is less than half of the channel area.

16. The method of claim 15, wherein the first region is the source region of the cell and the second region is the drain region of the cell.

17. The method of claim 16, wherein the cell is part of a flash EPROM.

18. The method of claim 15, wherein the first segment has an area in the range of approximately 10% to 20% of the channel area.

19. The method of claim 15, wherein the doping is performed by ion implantation using an ion selected from the group consisting of B+11 and BF2+49, a dose in the range of approximately 6E12 ions/cm$^2$, and an energy in the range of approximately 30 KeV to 125 KeV.

20. The method of claim 14, wherein the first region is the source region of the cell and the second region is the drain region of the cell.

21. The method of claim 20, wherein the cell is part of a flash EPROM.

22. The method of claim 20, wherein the first segment is less than half of the channel area.

23. The method of claim 20, wherein the doping is performed by ion implantation using an ion selected from the group consisting of B+11 and BF2+49, a dose in the range of approximately 6E12 ions/cm$^2$, and an energy in the range of approximately 30 KeV to 125 KeV.

24. The method of claim 14, wherein the cell is part of a flash EPROM.

25. The method of claim 24, wherein the first segment is less than half of the channel area.

26. The method of claim 24, wherein the doping is performed by ion implantation using an ion selected from the group consisting of B+11 and BF2+49, a dose in the range of approximately 6E12 ions/cm$^2$, and an energy in the range of approximately 30 KeV to 125 KeV.

* * * * *